United States Patent [19]

Rockett, Jr.

[11] 4,155,076

[45] May 15, 1979

[54] CCD GRAY-TO-BINARY CODE GENERATOR

[75] Inventor: Leonard R. Rockett, Jr., Cranbury, N.J.

[73] Assignee: RCA Corporation, New York, N.Y.

[21] Appl. No.: 863,921

[22] Filed: Dec. 23, 1977

[51] Int. Cl.² .............................................. H04L 3/00
[52] U.S. Cl. .............................. 340/347 DD; 307/216
[58] Field of Search ............ 307/216, 221 D; 357/24; 340/347 DD

[56] References Cited

U.S. PATENT DOCUMENTS 2,762,564   9/1956   Samson ......................... 340/347 DD

OTHER PUBLICATIONS

Séquin "Charge Transfer Devices", Jul. 1975, pp. 270-274.

Primary Examiner—Charles D. Miller
Attorney, Agent, or Firm—H. Christoffersen; Samuel Cohen

[57] ABSTRACT

N charge signals $G_{N-1} \ldots G_0$, each of different weight in N CCD channels, represent an N bit Gray code. The charge signal $G_{N-1}$ representing the most significant Gray code bit is sensed to produce an output charge signal $B_{N-1}$ representing the most significant binary digit. The $N-1$ remaining charge signals are processed by, in each case, adding a charge signal representing one Gray code bit $G_j$ to a charge signal $B_{j+1}$ representing the binary digit of next higher significance, spilling the resultant charge down a CCD channel containing a plurality of potential wells and in response to the sensing of how many, if any, of the potential wells fill with charge, producing an output charge representing the binary digit $B_j$.

5 Claims, 5 Drawing Figures

CCD GRAY-TO-BINARY CODE GENERATOR

The present invention relates to Gray-to-binary code conversion.

There is often a need in various digital signal processing and communications applications to translate signals representing a Gray code to signals representing a binary code. The present application describes a system for performing this function which readily can be integrated, which operates at relatively high speed and which is relatively simple in construction.

Figure 1:
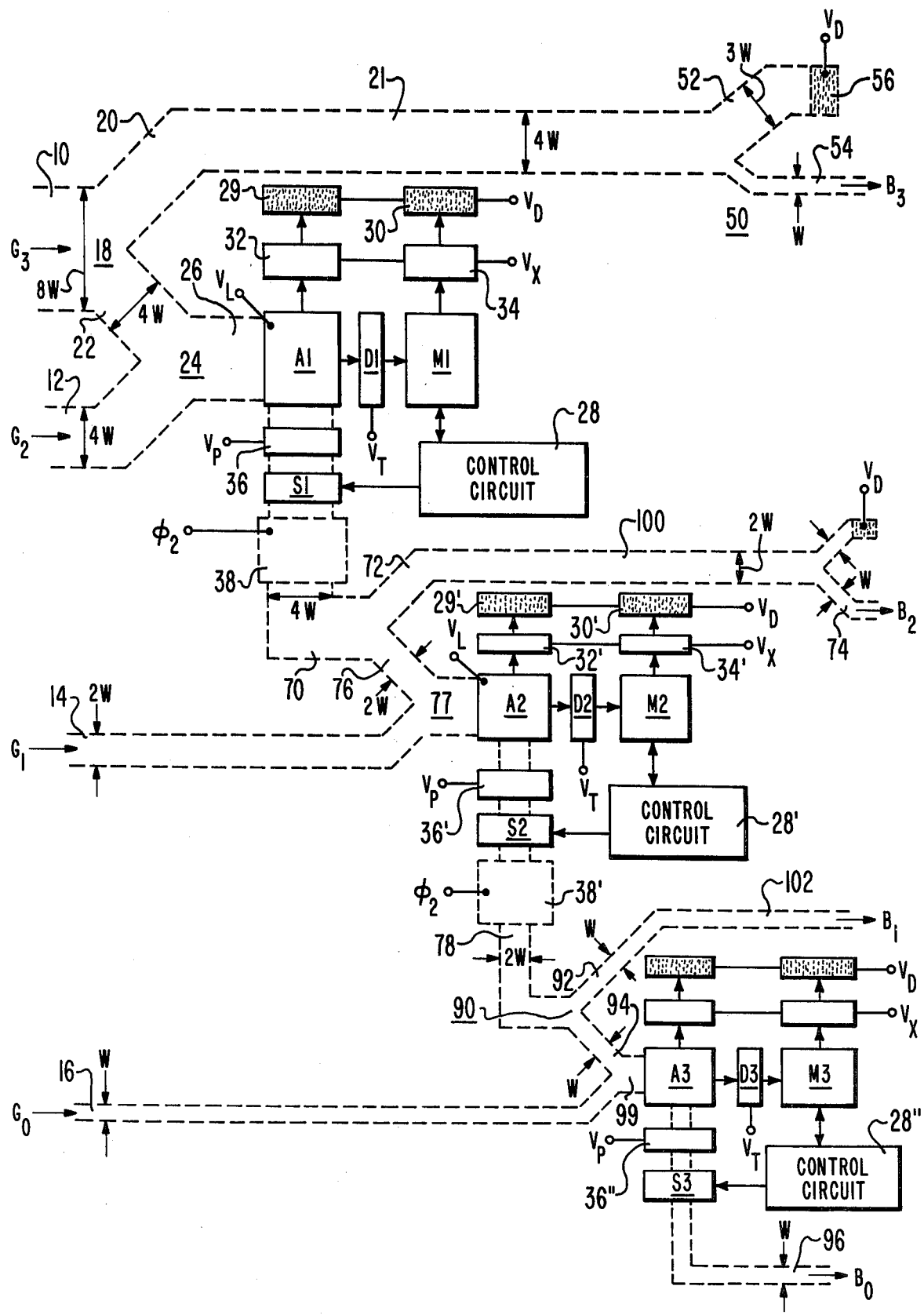
FIG. 1 is a schematic showing of a Gray-to-binary code converter embodying the invention.

A converter embodying the present invention employs charge coupled devices (CCD's). These are illustrated schematically in the various figures which show only the more important ones of the electrodes, some of the diffusions in the substrate, and which show also some of the circuits in block diagram form. The CCD's are assumed to be of the surface channel type with a P-type substrate (N channel). It is to be understood, of course, that this is an example only as the system is equally operative with P-channel, surface channel CCD's and with buried channel CCD's. The substrate is not illustrated but is assumed to be present. The electrodes are illustrated schematically—as rectangles. It is to be understood that any of the conventional electrode structures (single layer, double layer, triple layer, and so on) may be employed and further that well-known techniques for obtaining potential barriers, such as ion implants, may be employed where required, and that barriers made in this way may be substituted for the DC biased gate electrodes (D1-D3) illustrated. The channels are illustrated in FIG. 1 by dashed lines and some are not drawn to scale. Where electrodes for such channels perform their conventional function, in some cases they are not shown and in others some of the electrodes are shown in phantom.

Table I below shows the Gray and binary code equivalents of the decimal numbers 0 through 15.

TABLE I

| DECIMAL | GRAY | | | | BINARY | | | |
|---|---|---|---|---|---|---|---|---|
| | $G_3$ | $G_2$ | $G_1$ | $G_0$ | $B_3$ | $B_2$ | $B_1$ | $B_0$ |
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 1 | 0 | 0 | 1 | 0 |
| 3 | 0 | 0 | 1 | 0 | 0 | 0 | 1 | 1 |
| 4 | 0 | 1 | 1 | 0 | 0 | 1 | 0 | 0 |
| 5 | 0 | 1 | 1 | 1 | 0 | 1 | 0 | 1 |
| 6 | 0 | 1 | 0 | 1 | 0 | 1 | 1 | 0 |
| 7 | 0 | 1 | 0 | 0 | 0 | 1 | 1 | 1 |
| 8 | 1 | 1 | 0 | 0 | 1 | 0 | 0 | 0 |
| 9 | 1 | 1 | 0 | 1 | 1 | 0 | 0 | 1 |
| 10 | 1 | 1 | 1 | 1 | 1 | 0 | 1 | 0 |
| 11 | 1 | 1 | 1 | 0 | 1 | 0 | 1 | 1 |
| 12 | 1 | 0 | 1 | 0 | 1 | 1 | 0 | 0 |
| 13 | 1 | 0 | 1 | 1 | 1 | 1 | 0 | 1 |
| 14 | 1 | 0 | 0 | 1 | 1 | 1 | 1 | 0 |
| 15 | 1 | 0 | 0 | 0 | 1 | 1 | 1 | 1 |

It can be seen from the table that the following equations relate the binary digits to the various Gray code digits, where $\oplus$ represents the EXCLUSIVE OR function.

$$B_3 = G_3 \tag{1}$$

$$B_2 = G_2 \oplus G_3 \tag{2}$$

$$B_1 = G_1 \oplus G_2 \oplus G_3 \tag{3}$$

$$B_0 = G_0 \oplus G_1 \oplus G_2 \oplus G_3 \tag{4}$$

Equations 2, 3 and 4 can be translated to the following equations:

$$B_2 = G_2 \oplus B_3 \tag{5}$$

$$B_1 = G_1 \oplus B_2 \tag{6}$$

$$B_0 = G_0 \oplus B_1 \tag{7}$$

The CCD embodying the present invention performs the Gray-to-binary code translation by implementing equations 1, 5, 6 and 7.

Referring now to FIG. 1, the circuit embodying the invention is illustrated in terms of converting a four-digit Gray code $G_3 G_2 G_1 G_0$ to a four-digit binary code $B_3 B_2 B_1 B_0$, where the subscript 3 represents the most significant digit and the subscript 0, the least significant digit. The Gray code appears as four charge signals, each of different weight. The most significant digit $G_3$ comprises eights units of charge when it represents a 1 and substantially less than four units of charge when it represents a 0; the digit $G_2$ of next significance is represented by four units of charge when it represents a 1 and by substantially less than two units of charge when it represents a 0; the next digit $G_1$ is represented by two units of charge when it represents a 1 and by substantially less than one unit of charge when it represents a 0; and the least significant digit $G_0$ is represented by one unit of charge when it represents a 1 and by substantially less than one half unit of charge when it represents a 0. Charges of such magnitudes are easily produced by, for example, introducing charge in some standard way (such as "spill and fill") into CCD channels of different widths and employing in each channel, electrodes of the same length (where "length" is the electrode dimension in the charge propagation direction). In the present example, channel 10 has a width 8W, channel 12 a width 4W, channel 14 a width 2W and channel 16 and width W, so that when a 1 is introduced into channel 10 in response to an input signal, 8 units of charge are produced and stored, when a 1 is introduced into channel 14, 4 units of charge are produced and stored, and so on.

In the discussion above it is stated that substantially less than one half of a "1" charge represents a 0. In the case of a surface channel device, a 0 may be represented by a small amount of charge, say 10%–20% of a full well, termed a "fat zero" in order to improve the transfer efficiency, that is, to reduce charge losses during the propagation of charges along a CCD channel due to so-called "fast trapping states" at the substrate surface.

This phenomenon is well understood in the art. In the case of a buried channel CCD, the less than half of a "1" charge referred to may actually be zero charge under optimum conditions. It is to be understood that the expressions in the claim referring, for example, to a "substantial absence of charge" are intended to be generic to these various cases and also to the presence of a small amount of charge due to noise.

Channel 10 divides into two parts at junction 18, half of the charge flowing into the upper channel 20 and the remaining half of the charge into the other channel 22. The charge in channel 12 adds to the charge in channel 22 at junction 24 and the sum charge passes into channel 26. The CCD channel 26 may have the same width 8W as channel 10 (assuming the CCD transfer electrodes (not shown) for channel 26 are the same length as the CCD transfer electrodes (not shown) for channels 10 and 12).

There is located over channel 26 three CCD electrodes A1 followed by D1 followed by M1. It may be assumed that electrode A1 is maintained at a positive DC level $V_L$ and is of the same length as electrode M1. Control circuit 28 periodically resets electrode M1 to a DC level $+V_D$ where $V_D$ normally is slightly greater than $V_L$. At these voltage levels there are potential wells present in the substrate beneath electrodes A1 and M1, each such well being of a depth sufficient to store only four units of charge. Electrode D1 is maintained at a less positive potential $V_T$ such that there is a potential barrier between the wells beneath electrodes A1 and M1.

The charge in the potential wells just discussed, when such charge is present, periodically is removed from these potential wells and conveyed to two drain regions 29 and 30, respectively. These may comprise diffusions in the substrate of opposite conductivity type than the substrate which are maintained at a positive potential $V_D$. Located between these drains and the electrodes A1 and M1, are two gate electrodes 32 and 34. Their purpose is to permit the transfer of charge from the potential wells beneath the A1 and M1 electrodes to the drains at an appropriate time during the operation of the circuit, as will be discussed shortly.

The electrode M1, which may be considered a master electrode, controls the substrate potential beneath electrode S1, which may be considered a slave electrode. In the present circuit, the charge comprises electrons and when electrons are present in the potential well beneath electrode M1, the slave electrode is driven relatively negative so that a potential barrier is present beneath electrode S1. Conversely, when no charge is present beneath electrode M1, the slave electrode S1 is relatively positive and a potential well or conduction channel is present beneath electrode S1.

Electrode 36 comprises a transfer electrode which is controlled by the voltage $V_P$. When $V_P$ goes relatively positive, a conduction channel forms beneath electrode $V_P$ and if charge is present in the potential well beneath electrode A1, it can flow out of this well, provided slave electrode S1 is relatively positive as will be discussed shortly.

Except for the $\phi_2$ electrodes 38 and 38' which are shown in phantom, the remaining multiple phase electrodes are not illustrated in FIG. 1. The assumption is that four-phase operation is employed and that the operation of the four electrodes per CCD stage is conventional.

What has just been described is the portions of the CCD which translate the Gray code digit $G_3$ to the binary digit $B_3$ and which translate the Gray code digits $G_3$ and $G_2$ to the binary digit $B_2$. The remaining portions of the CCD are similar to those already discussed and are identified by somewhat similar characters. Thus, electrode A2 performs a similar function to electrode A1; electrode D2 performs a similar function to electrode D1; electrode M2 performs a similar function to electrode M1; and so on. However, while electrodes A1 and M1 produce potential wells which each have a capacity of four units of charge, the wells beneath electrodes A2 and M2 each have a capacity of only two units of charge, and the wells beneath electrodes A3 and M3 each have a capacity of only one unit of charge.

The operation of the system of FIG. 1 will be illustrated by giving a number of specific examples and tracing the circuit operation for each example. Assume first that the Gray code is 1100. The eight units of charge in channel 10 produce four units of charge in channel 20. The charges in channel 20 are propagated down channel 20 until they reach the charge divider 50. This divider comprises one channel 52 having a width 3W and a second channel 54 having a width W. The four units of charge in channel 20 subdivide into two channels in the ratio of 3:1 and the one unit of charge subsequently propagates down channel 54 and appears as an output $B_3 = 1$. The three units of charge propagate down channel 52 and eventually reach the drain diffusion 56 which is maintained at a positive potential $V_D$. This charge (electrons) flows into the drain.

Figure 2:
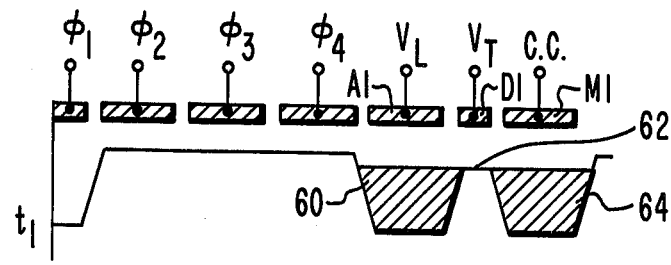
FIG. 2 is a drawing showing a surface potential profile present in a region of the substrate of the system of FIG. 1.
Figure 3:
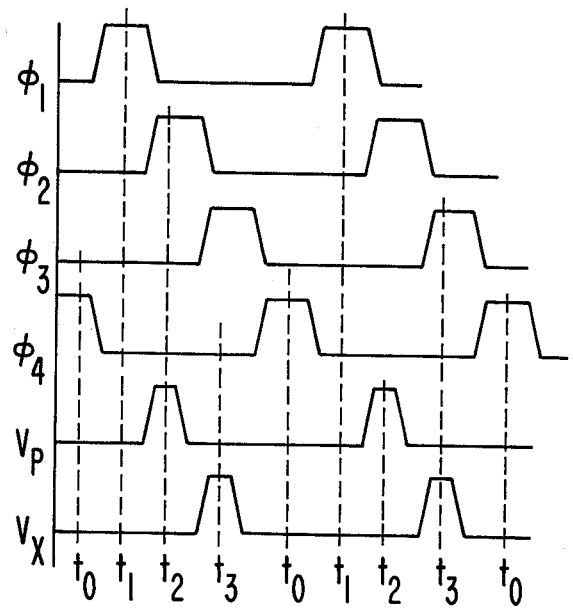
FIG. 3 is a drawing of waveforms employed in the operation of the system of FIG. 1.

The four units of charge in channel 22 add to the four units of charge in channel 12 at junction 24. Assume that the CCD previously has been reset, that is, that no charge is present in the potential wells beneath electrodes A1 and M1. Referring briefly to FIGS. 2 and 3, at time $t_0$ when the $\phi_4$ electrode (not shown in FIG. 1 but which is immediately adjacent to the A1 electrode) goes positive, the eight units of charge flow partially into the potential well beneath the $\phi_4$ electrode and partially into the potential well beneath the A1 electrode. A short time later at $t_1$ when $\phi_4$ goes relatively negative (actually less positive), the charge formerly in the potential well beneath the $\phi_4$ electrode flows into the potential well 60 beneath electrode A1. As there are eight units of charge and as the potential well 60 can store only four units of charge, the charge overflows this well, that is, it flows over the barrier 62 beneath electrode D1 and spills into the potential well 64 beneath master electrode M1. Thus, potential wells 60 and 64 are both filled.

A short time later, at time $t_2$, voltage $V_P$ goes high as shown in FIG. 3 so that a conduction channel is present beneath electrode 36. However, as master electrode M1 is over a potential well which is filled with electrons, it drives slave electrode S1 relatively negative and the potential barrier beneath this slave electrode prevents any of the charge in potential well 60 beneath electrode A1 from passing into the potential well beneath electrode 38 (note that at time $t_2$ there is a potential well present beneath the $\phi_2$ electrode 38 (see FIG. 3)).

As no charge can pass beneath electrode 38, no charge passes into the CCD channel 70. This channel has a width of 4W. As there is no charge present in channel 70, no charge passes into the channel 72 of width 2W. Accordingly, no charge propagates down channel 100 and no charge arrives at the output CCD channel 74 which is of width W. Thus $B_2 = 0$.

As there is no charge present in channel 70, no charge passes into channel 76, the latter also being 2W wide. The input Gray code digit $G_1$ is zero so that no charge passes into channel 14. Therefore, no charge passes into junction 77 to the 4W wide channel leading to the A2 electrode. It can be shown that under these circumstances no charge passes into the 2W wide CCD channel 78. Because of this and because the least significant Gray code digit $G_0$ is zero, the binary digits $B_1$ and $B_0$ are both zero. Thus, Gray code 1100 has been translated to the binary code 100 and this is consistent with the table above.

Note in connection with the above that $G_3$ is translated directly to $B_3$. Note also that the charge in channel 22 is equal to the charge in channel 20 which represents the binary digit $B_3$. It therefore can be said that at CCD junction 24 the charges representing $G_2$ and $B_3$ are added and it can be shown that the portion of the CCD including A1 and M1 solves the logic equation $B_2 = G_2 \oplus B_3$, that is, it solves euqations 5 above. Using similar reasoning, it can be shown that the two other portions of the CCD which are illustrated in a schematic way, solve equations 6 and 7, respectively.

One other example will be given of the operation and that is the conversion of the Gray code 1110 to a binary code. The eight units of charge representing $G_3$ produce an output $B_3 = 1$ in the manner already indicated. When $G_3$ and $G_2$ are both 1, $B_2$ is 0, the circuit operation being exactly like that which has already been discussed.

In the present example, $G_1 = 1$. Thus, there are two units of charge which pass down CCD channel 14 and for the reasons already discussed, there are zero units of charge present in channel 76. The two units of charge pass through CCD junction 77 and by the time $t_1$ of FIG. 3 fill the well beneath the A2 electrode. Recall that electrodes A2 and M2 produce potential wells which each have a capacity of only two units of charge. At the time $t_1$, since there are only two units of charge which are available, none of this charge overflows the barrier beneath electrode D2 so that no charge passes into the potential well beneath electrode M2. Accordingly, slave electrode S2 is relatively positive and there is a conduction channel present beneath this electrode. At time $t_2$ when $V_P$ goes high, the charge formerly present beneath the A2 electrode flows through the conduction channels beneath electrodes 36' and S2 to the potential well produced by the $\phi_2$ electrode 38'. These two units of charge subsequently propagate down channel 78 until they reach junction 90 where one of the units of charge passes into the CCD channel 92 and the other passes into CCD channel 94. The one unit of charge in channel 92 subsequently propagates down channel 102 and becomes the output signal $B_1 = 1$.

The one unit of charge in channel 94 propagates to beneath the A3 electrode. Recall that $G_0 = 0$ so that no charge propagates down channel 16. The potential wells beneath electrodes A3 and M3 each have a capacity of only one unit of charge. Accordingly, the one unit of charge which arrives at A3 at a time $t_1$ does not pass over the barrier beneath the D3 electrode and the potential well beneath electrode M3 remains empty. Thus, slave electrode S3 is relatively positive and a conduction channel is present beneath this electrode. When at time $t_2$, $V_P$ goes high, the charge present beneath electrode A3 passes through the conduction channels beneath electrodes 36" and S3 to the adjacent $\phi_2$ electrode (not shown). This one unit of charge subsequently propagates down output channel 96 and becomes the $B_0 = 1$ output. Thus, the Gray code 1110 has been translated to the binary code 1011 which is consistent with the table above.

All of the circuits just discussed periodically are reset as shown in FIG. 3. The reset may occur at time $t_3$. At this time, if there is any charge present beneath an M electrode, it passes to a drain.

It can be seen from the explanation above that charges representing the more significant digits are generated before charges representing the least significant digits. To keep things in synchronism, therefore, a channel such as 10 is made sufficiently shorter than a channel such as 16 so that any charge present in channel 16 will arrive at the junction 99 at the same time that the charges in channel 94 arrives at this junction. In other words, there is a greater delay between the input end of channel 16 and the junction 99 than between the input end of channel 10 and junction 18. The required amount of delay is obtained simply by employing more CCD stages in channel 16 than in channel 10. In similar fashion, channel 14 is shorter than channel 16 and longer than channel 12, in terms of delay time. By the same token, if it is desired that the binary digits be available concurrently, a channel such as 20, 21 is made longer than the channel such as 72, 100 and the latter is made longer than a channel such as 92, 102 and so on.

FIG. 2 has already been discussed briefly. One set of four multiple phase electrodes is illustrated in this figure and the appropriate waveforms for driving these electrodes are shown in FIG. 3. In the discussion above, when the times $t_0-t_3$ are discussed, it is to be understood that these times repeat each period. Thus, during one period the $B_2$ digit is generated. During a following period, in times $t_0-t_3$, a following digit $B_1$ is generated and so on.

Figure 4:
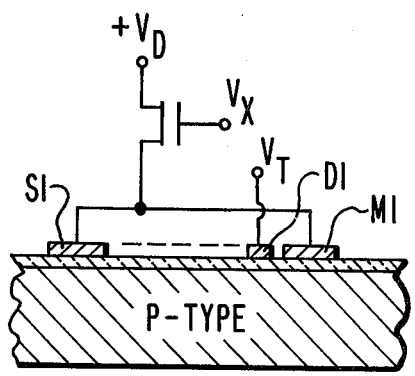
FIG. 4 is a section through a portion of the system of FIG. 1.

FIG. 4 illustrates one form that a control circuit such as 38 may take. Here, the master electrode is a floating gate electrode M1. At time $t_3$, when $V_X$ is high, the master and slave electrodes M1 and S1, respectively, are both reset to the reference level $+V_D$. Thereafter, both electrodes remain floating with any change in the surface potential beneath the master electrode M1 controlling the potential of the slave electrode S1.

Figure 5:
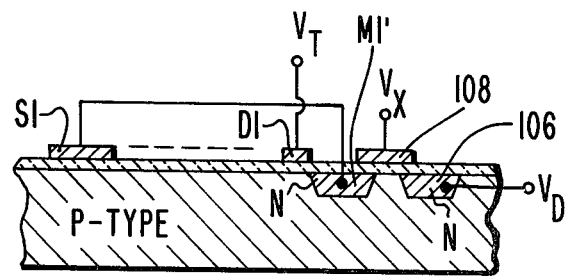
FIG. 5 is a section showing a modified arrangement which performs the same function as what is shown in FIG. 4.

FIG. 5 illustrates an alternative to the arrangement of FIG. 4. In FIG. 5 rather than using a floating gate electrode M1, a floating diffusion M1' is employed. This floating diffusion periodically is reset at time $t_3$ to the potential $V_D$ of a drain diffusion 106 by applying the pulse $V_X$ to the gate electrode 108. Here the control circuit 28 function is performed by the reset structure 106, 108 which, in practice, correspond to circuit elements 30 and 34, respectively, of FIG. 1.

As a third alternative, the control circuit may include a differential signal detector as illustrated in FIG. 8 of copending application Ser. No. 799,710 for "CCD A-to-D Converter" filed May 23, 1977 by the present applicant and assigned to the same assignee as the present application.

The invention has been illustrated in terms of the conversion of a four-bit Gray code to a four-bit binary code. This embodiment is particularly useful as it may also be employed for binary-coded decimal conversions. However, it is to be understood that the circuit illustrated is just one example as the invention is applicable to the conversion of more or fewer than four Gray code bits to a corresponding number of binary digits.

It is also to be understood that while in the embodiment illustrated, the output charges are translated to charges all of the same weight, in some applications it is not necessary to perform such translation. It these applications, for example, the presence of a charge may be sensed as a voltage which represents a 1 and the absence of a charge as a voltage which represents a 0. The amount of charge which is sensed in this case can be larger or smaller, without adversely affecting the circuit operation if the electrodes are of different area so that the charge densities representing a 1 are the same in the different channels. As another alternative, a threshold circuit may be employed of the type in which any charge which produces a voltage exceeding a given level will be translated to a fixed voltage level representing a 1 and any charge which produces a voltage of lower value will be translated to a second fixed voltage level representing a 0.

What is claimed is:

1. A charge-coupled device (CCD) Gray-to-binary code converter comprising, in combination:

N input CCD channels for N charge signals $G_{N-1}$ ... $G_0$ indicative of an N digit Gray code, where $G_{N-1}$ represents the digit of greatest significance and $G_0$ the digit of least significance, each charge signal $G_j$ other than $G_0$ comprising a charge packet which is substantially twice as large as the charge packet $G_{j-1}$ representing the Gray code digit of next lower significance than $G_j$;

means for deriving from the charge signal $G_{N-1}$, a charge signal $B_{N-1}$ indicative of the binary code digit of greatest significance; and $N-1$ means, each for adding to a different charge signal $B_j$ indicative of a binary code digit, a charge signal $G_{j-1}$ indicative of the Gray code digit of next lower significance than said binary code digit, each such means for thereby obtaining a different sum charge packet $S_{j-1}$ and for deriving from each said sum charge packet a charge signal $B_{j-1}$ indicative of the binary code digit of $j-1$'th significance, where j is an integer having the values $(N-1)$ ... 1.

2. A CCD Gray-to-binary code converter as set forth in claim 1, wherein each said means for adding comprises means for producing in a first CCD channel a charge packet $B_j$, means for producing in a second CCD channel a charge packet $G_{j-1}$, which when it and $B_j$ both represent a 1 are of the same size, a third CCD channel, and means for concurrently propagating $B_j$ and $G_{j-1}$ into said third channel where these two charges combine.

3. A CCD Gray-to-binary code converter as set forth in claim 2, wherein each means for deriving from a sum charge packet $S_{j-1}$ a charge signal $B_{j-1}$ comprises:

means for creating in said third CCD channel first and second serially occurring potential wells, in that order, separated from one another by a potential barrier, each such well having a capacity for only substantially one half of the maximum value of said sum charge packet;

means for spilling said sum charge packet $S_{j-1}$ into said third CCD channel, whereby if said sum charge packet is at its maximum value, that charge fills said first potential well, overflows said barrier, and also fills said second potential well, and if said sum charge packet contains approximately one-half of its maximum value of charge, that charge fills only said first potential well, and if said sum charge packet has a substantially smaller amount of charge, neither potential well becomes filled;

an output CCD channel;

means responsive to the presence of substantial charge in said second potential well for preventing the charge in said first potential well from being propagated to said output CCD channel; and means for propagating the charge in said first potential well to said output channel only when there is substantial charge in said first potential well and a substantial absence of charge in said second potential well.

4. A charge-coupled device (CCD) Gray-to-binary code converter comprising, in combination:

N input CCD channels for N charge signals $G_{N-1}$ ... $G_0$ indicative of an N digit Gray code, where $G_{N-1}$ represents the digit of greatest significance and $G_0$ the digit of least significance, each charge signal $G_j$ other than $G_0$ comprising a charge packet which is substantially twice as large as the charge packet $G_{j-1}$ representing the Gray code digit of next lower significance than $G_j$, where N is an integer and j is an integer having the values 1 ... $N-1$;

means for dividing the charge signal $G_{N-1}$, into two equal parts, each such part comprising a charge signal $B_{N-1}$ indicative of the binary code digit of greatest significance;

means for adding one of the charge signal $B_{N-1}$ to the charge signal $G_{N-1}$ to obtain a sum charge packet $S_{N-2}$ and for obtaining therefrom a charge signal $B_{N-2}$; and starting with charge $B_j = B_{N-2}$, means for dividing each such charge in half to obtain two charge packets $B_j/2$, each charge packet $B_j/2$ being indicative of binary code digit of significance j, and means for adding one of the charge packets $B_j/2$ to the charge packet $G_{j-1}$ to obtain a sum charge packet $S_{j-1}$ and for obtaining therefrom a charge packet $B_{j-1}$.

5. A CCD Gray-to-binary code converter as set forth in claim 4, wherein the means for obtaining from each sum charge packet $S_{j-1}$ a charge packet $B_{j-1}$ comprises:

A CCD channel;

means for creating in said CCD channel first and second serially occurring potential wells, in that order, separated from one another by a potential barrier, each such well having a capacity for only substantially one half of the maximum value of said sum charge packet $S_{j-1}$;

means for spilling said sum charge packet into said CCd channel, whereby if said sum charge packet is at its maximum value, that charge fills said first potential well, overflows said barrier, and also fills said second potential well, and if said sum charge packets contains approximately one half of its maximum value of charge, that charge fills only said first potential well, and if said sum charge packet has a substantially smaller amount of charge, neither potential well becomes filled;

an output CCD channel;

means responsive to the presence of substantial charge in said second potential well for preventing the charge in said first potential well from being propagated to said output CCD channel; and means for propagating the charge in said first potential well to said output channel only when there is substantial charge in said first potential well and a substantial absence of charge in said second potential well, said charge propagated to said output channel comprising the charge packet $B_{j-1}$.

* * * * *

UNITED STATES PATENT AND TRADEMARK OFFICE
CERTIFICATE OF CORRECTION

PATENT NO. : 4,155,076
DATED : May 15, 1979
INVENTOR(S): Leonard R. Rockett, Jr.

It is certified that error appears in the above-identified patent and that said Letters Patent is hereby corrected as shown below:

Column 2, line 38, "eights" should be --eight--.

Column 2, line 56, "and" (second occurrence) should be --a--.

Column 5, line 11, "100" should be --1000--.

Column 5, line 20, "euqations" should be --equations--.

Column 7, line 4, "It" should be --In--.

Column 8, line 49, "CCd" should be --CCD--.

Column 8, line 53, "packets contains" should be --packet contains--.

Signed and Sealed this

Twenty-first Day of August 1979

[SEAL]

Attest:

LUTRELLE F. PARKER
Attesting Officer
Acting Commissioner of Patents and Trademarks